United States Patent

Nagai et al.

Patent Number: 5,900,055
Date of Patent: May 4, 1999

[54] METHOD OF MANUFACTURING SILICON MONOCRYSTAL BY CONTINUOUSLY CHARGED CZOCHRALSKI METHOD

[75] Inventors: Naoki Nagai; Koji Mizuishi; Michiaki Oda, all of Annaka, Japan

[73] Assignee: Shin-Etsu Handotai Co., Ltd., Tokyo, Japan

[21] Appl. No.: 08/829,894

[22] Filed: Mar. 25, 1997

[30] Foreign Application Priority Data

Mar. 27, 1996 [JP] Japan ................................ 8-097700

[51] Int. Cl.$^6$ .................................................. C30B 15/02
[52] U.S. Cl. ............................. 117/33; 117/18; 117/213; 117/214
[58] Field of Search ................................ 117/18, 19, 20, 117/33, 213, 214, 928

[56] References Cited

U.S. PATENT DOCUMENTS

| | | | |
|---|---|---|---|
| 2,892,739 | 6/1959 | Rusler | 117/19 |
| 5,034,200 | 7/1991 | Yamashita et al. | 117/31 |
| 5,073,229 | 12/1991 | Yamashita et al. | 117/31 |

FOREIGN PATENT DOCUMENTS

| | | |
|---|---|---|
| A 330189 | 8/1989 | European Pat. Off. . |
| A 350305 | 1/1990 | European Pat. Off. . |
| A 388503 | 9/1990 | European Pat. Off. . |
| A 1-196081 | 11/1959 | France . |
| A 1-204436 | 1/1960 | France . |
| A 2-152801 | 5/1972 | Germany . |
| 401294589 | 11/1989 | Japan . |

*Primary Examiner*—Felisa Hiteshew
*Attorney, Agent, or Firm*—Oliff & Berridge, PLC

[57] ABSTRACT

A silicon monocrystal is manufactured according to the continuously charged Czochralski method in which a double crucible is used which includes an outer crucible and an inner crucible which communicate with each other through pores. A dopant is charged to the silicon melt stored in the double crucible before commencing pulling of a silicon monocrystal such that the ratio of the dopant concentration of the silicon melt stored in the outer crucible to the dopant concentration of the silicon melt stored in the inner crucible becomes greater than an effective segregation coefficient of the dopant. The silicon monocrystal is then pulled while silicon material is charged to the silicon melt within the outer crucible, during which the dopant concentration ratio becomes equal to the effective segregation coefficient and then becomes smaller than the effective segregation coefficient. When the dopant concentration ratio becomes smaller than the effective segregation coefficient, the dopant is charged to the silicon melt stored in the outer crucible. The above operation is repeated, so that the specific resistance of the silicon monocrystal pulled from the double crucible can be controlled within a desired range using commonly-employed dopant.

12 Claims, 7 Drawing Sheets

METHOD OF MANUFACTURING SILICON MONOCRYSTAL BY CONTINUOUSLY CHARGED CZOCHRALSKI METHOD

BACKGROUND OF THE INVENTION

1. Field of the Invention

The present invention relates to an improved continuously charged Czochralski method (i.e., a CCZ method) of manufacturing a silicon monocrystal and, more particularly, to a method of manufacturing a silicon monocrystal whose resistivity is controlled so as to fall within a predetermined range. Further, the present invention relates to a dopant feeding apparatus suitable for use in the manufacturing method.

2. Description of the Related Art

There exists a CCZ method in which a silicon monocrystal is pulled while silicon material is supplied to silicon melt whose volume reduces as a result of pulling of the silicon monocrystal. This method enables the pulling of a longer silicon monocrystal from one crucible, thereby improving manufacturing yield and reducing manufacturing costs of the silicon monocrystal.

In the ordinary CZ method, in order to control the resistivity of a silicon monocrystal to be pulled, the silicon monocrystal is pulled while dopant; e.g., boron, phosphorous, or antimony, is added to the silicon melt. Introduction of dopant into the silicon monocrystal is dependent on segregation. As the pulling of silicon monocrystal proceeds, the dopant concentration of the remaining silicon melt increases, and, as a result, the resistivity of the silicon monocrystal to be pulled gradually decreases.

At this time, the resistivity of the silicon monocrystal is determined by an exponential curve defined by an effective segregation coefficient ($k_{eff}$) of the dopant. The term "effective segregation coefficient ($k_{eff}$) of the dopant" is used herein to refer to a segregation coefficient when a silicon monocrystal is actually grown. For example, if the resistivity is measured at both longitudinal ends of the silicon monocrystal block, the distribution of resistivity of the area of silicon monocrystal block between its longitudinal ends can be determined from the exponential curve. Because of this, it is possible to confirm which portion of the silicon monocrystal block has a desired range of resistivity without the need of any further measurements.

However, according to the ordinary CZ Method, the resistivity of the silicon monocrystal to be pulled decreases exponentially for reasons of segregation, and therefore the resistivity of the latter half of the silicon monocrystal deviates from a desired range of resistivity, thereby resulting in decreased manufacturing yield.

To prevent the previously-described problem, an improved CCZ method has been developed. According to this method, the silicon monocrystal is pulled while its resistivity is controlled by charging silicon material to the silicon melt whose volume reduces as a result of pulling of the silicon monocrystal, so as to prevent the dopant concentration of the silicon melt from increasing. In this method, if the silicon material is charged so as to maintain the dopant concentration of the silicon melt constant, the resistivity of the silicon monocrystal to be pulled can be maintained constantly. However, it will be impossible to pull a too long silicon monocrystal without addition of the dopant. In some cases, a longer silicon monocrystal is pulled through addition of dopant as well as silicon material to the silicon melt.

In this case, there is a method of pulling a silicon monocrystal while charging to silicon melt a mixture of granular silicon material and dopant-containing granular silicon material that has the same shape distribution as the granular silicon material and is capable of being evenly mixed with the granular silicon material. The granular silicon material and the dopant-containing granular silicon material are mixed in a suitable ratio. The dopant-containing granular silicon material is special material, and therefore this method is impracticable.

There is still another method of pulling a silicon monocrystal while continuously charging dopant—which is different in shape distribution from the granular silicon material and does not evenly mix with the granular silicon material— to the silicon melt separately from the granular silicon material. In this method, since the amount of dopant to be continuously charged is small, a large amount of errors arise in the amount of dopant to be added. As a result, variations in the resistivity of the silicon monocrystal to be pulled become greater. For this reason, this method is also impracticable.

In the previously-described methods, there may be used a double crucible comprising an outer crucible and an inner crucible which communicate with each other through pores. Use of the double crucible is intended to control the resistivity of a silicon monocrystal to be pulled by continuously charging dopant to the silicon melt stored in the outer crucible, and by causing the thus-charged dopant to flow into the inner crucible through the pores. Since it is impossible to measure the resistivity of the silicon monocrystal while it is being pulled, it is impossible to control the amount of dopant to be charged to the silicon melt of the outer crucible on the basis of feedback on the resistivity of the silicon monocrystal. Therefore, the resistivity of a resultantly-obtained silicon monocrystal may deviate from a desired range.

In contrast to the ordinary CZ method, even if the resistivity is measured at both longitudinal ends of the silicon monocrystal block, the distribution of resistivity of the area of the silicon monocrystal between its longitudinal ends cannot be determined, because the dopant is continuously charged during the course of pulling of the silicon monocrystal. Because of this, without further measurement of resistivity it is impossible to confirm which portion of the silicon monocrystal block has a desired range of resistivity.

SUMMARY OF THE INVENTION

In view of the aforementioned drawbacks, an object of the present invention is to provide an improved CCZ method of manufacturing a silicon monocrystal in which the resistivity of a silicon monocrystal pulled from a double crucible can be controlled within a desired range using commonly-employed dopant.

Another object of the present invention is to provide a dopant feeding apparatus suitable for use in the improved CCZ method.

Through various studies made, the inventors of the present invention have discovered the following phenomenon with regard to a CCZ method of manufacturing a silicon monocrystal in which a silicon monocrystal is pulled while silicon material is charged to silicon melt stored in a double crucible. In this discussion, $C_s(O)$ represents the initial resistivity of a silicon monocrystal, $C_s(W)$ represents the resistivity of the silicon monocrystal after being grown to a weight W, $C_{out}(W)$ represents the dopant concentration of the silicon melt stored in the outer crucible, and $C_{in}(W)$ represents the dopant concentration of the silicon melt stored in the inner crucible. The ratio of resistivity ($C_s(O)/C_s(W)$)

of the silicon monocrystal to be pulled from the double crucible can be controlled so as to fall within a certain range using commonly-used dopant, so long as pulling of a silicon monocrystal is commenced in a state in which the ratio of $C_{outl}(W)$ to $C_{inl}(W)$, or $C_{outl}(W)/C_{inl}(W)$ (hereinafter may be referred to as the dopant concentration ratio), is larger than an effective segregation coefficient ($k_{eff}$) of the dopant, namely, in a state in which $C_{outl}(O)/C_{inl}(O) > k_{eff}$; when the ratio $C_{outl}(W)/C_{inl}(w)$ becomes smaller than $k_{eff}$, the dopant is recharged to the silicon melt stored in the outer crucible so as to make the ratio $C_{outl}(W)/C_{inl}(W)$ greater than $k_{eff}$; and this operation is repeated whenever the dopant concentration ratio becomes smaller than the effective segregation coefficient.

In the light of the previously-described phenomenon, the present invention provides an improved CCZ method of manufacturing a silicon monocrystal in which a silicon monocrystal is pulled while silicon material is charged to silicon melt stored in a crucible. The crucible is a double crucible composed of an outer crucible and an inner crucible which communicate with each other through pores. The method comprises the steps of:

(a) charging a dopant to the silicon melt stored in the double crucible before commencing pulling of a silicon monocrystal such that the ratio of the dopant concentration of the silicon melt stored in the outer crucible to the dopant concentration of the silicon melt stored in the inner crucible becomes greater than an effective segregation coefficient of the dopant;

(b) pulling the silicon monocrystal while charging silicon material to the silicon melt within the outer crucible, during which the dopant concentration ratio becomes equal to the effective segregation coefficient and then becomes smaller than the effective segregation coefficient;

(c) recharging the dopant to the silicon melt stored in the outer crucible when the dopant concentration ratio becomes smaller than the effective segregation coefficient such that the ratio of the dopant concentration of the silicon melt stored in the outer crucible to the dopant concentration of the silicon melt stored in the inner crucible becomes greater than the effective segregation coefficient; and (d) repeating the recharging step (c).

Preferably, when the dopant concentration of the silicon melt stored in the inner crucible becomes equal to its initial value before commencement of pulling of the silicon monocrystal, the dopant is charged to the silicon melt of the outer crucible. More preferably, when the dopant concentration of the silicon melt stored in the inner crucible becomes equal to its initial value before commencement of pulling of the silicon monocrystal, the dopant concentration of the silicon melt stored in the outer crucible is made equal to its initial value before commencement of pulling of the silicon monocrystal by charging the dopant to the silicon melt of the outer crucible. As a result of this, it is possible to better control the range of the resistivity of the silicon monocrystal to be pulled.

Further, the present invention provides a dopant feeding apparatus for use with the previously-described CCZ method of manufacturing a silicon monocrystal. The dopant feeding apparatus comprises a plurality of dopant storage sections capable of charging dopant to silicon melt a plurality of times.

In the present invention, the ratio of resistivity [i.e., $C_s(O)/C_s(W)$] of the silicon monocrystal pulled from the double crucible can be controlled within a desired range using commonly-employed dopant. Accordingly, the present invention allows a silicon monocrystal having a desired range of resistivity to be manufactured at high yield and low cost.

DESCRIPTION OF THE PREFERRED EMBODIMENT

An embodiment of the present invention will now be described with reference to the drawings.

Figure 1:
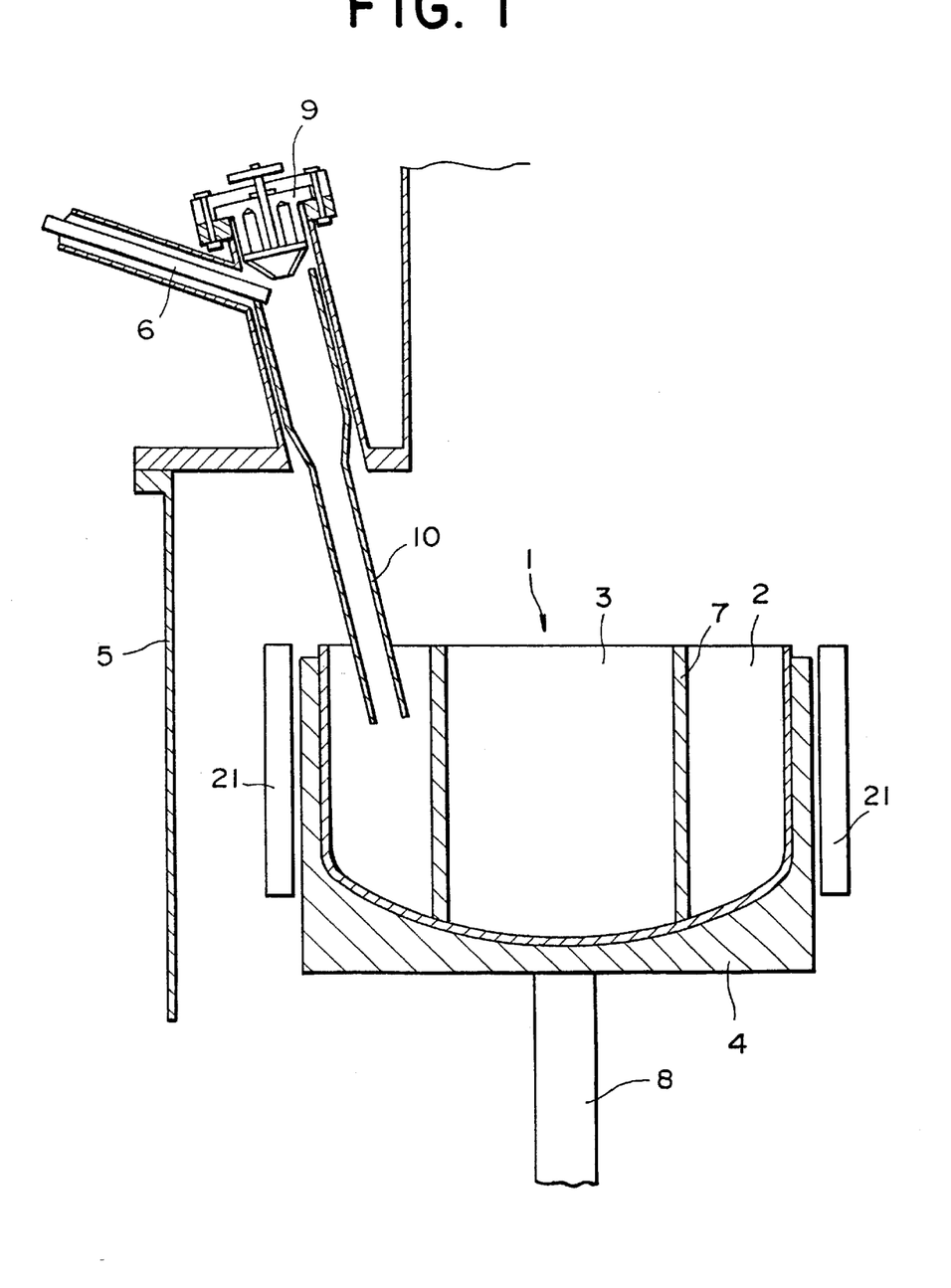
FIG. 1 is a schematic cross-sectional view showing an example of an apparatus used in a method of manufacturing a silicon monocrystal according to the present invention.

In FIG. 1, reference numeral 1 denotes a double quartz-crucible, 2 denotes an outer crucible, and 3 denotes an inner crucible. The double quartz-crucible 1 is supported by a graphite crucible 4 and is housed in a chamber 5. The outer crucible 2 and the inner crucible 3 communicate with each other through pores (not shown) formed in an interior wall 7. A rotary shaft 8 is attached to the graphite crucible 4, whereby the double quartz-crucible 1 and the graphite crucible 4 can rotate and are vertically movable. When a silicon monocrystal is manufactured, the silicon melt stored in the double quartz-crucible 1 is heated by a heater 21, or silicon material and dopant supplied to the double quartz-crucible 1 are heated by the heater 21 so as to become melted.

The apparatus is equipped with a feed pipe 10 for introducing granular silicon material into the outer crucible 2. The granular silicon material is supplied to the feed pipe 10 from a feeder 6. The feeder 6 is capable of continuously or intermittently supplying the granular silicon material to the feed pipe 10 in a fixed or variable amount.

Further, the present apparatus is equipped with a dopant feeding apparatus 9 capable of feeding a predetermined amount of dopant to silicon melt a plurality of times at desired points of time.

In a CCZ method of manufacturing a silicon monocrystal according to the present invention, before pulling of the silicon monocrystal is commenced, the dopant is charged to the silicon melt stored in the double crucible such that the dopant concentration ratio is greater than an effective segregation coefficient; namely, $$C_{outl}(W_1)/C_{inl}(W_1) = C_{outl}(O)/C_{inl}(O) > k_{eff}, \quad (i)$$

The effective segregation coefficient depends on the sort of the used dopant. Then, the pulling of the silicon monocrystal is commenced.

While the silicon material is supplied to the silicon melt stored in the outer crucible via the feed pipe so as to maintain a constant amount of silicon melt in the double quartz-crucible, the pulling of the silicon monocrystal is continued. As a result of charging of the silicon material to the silicon melt stored in the outer crucible, the dopant concentration of the silicon melt stored in the outer crucible decreases. Eventually, the dopant concentration ratio becomes equal to the effective segregation coefficient; namely, $$C_{outl}(W_2)/C_{inl}(W_2) = k_{eff}. \quad (ii)$$

Further, while the granular silicon material is supplied to the silicon melt stored in the outer crucible via the feed pipe so as to maintain a constant amount of silicon melt in the double quartz-crucible, the pulling of the silicon monocrystal is continued. As a result of this, the dopant concentration of the silicon melt stored in the outer crucible decreases further. Eventually, the dopant concentration ratio becomes smaller than the effective segregation coefficient; namely, $$C_{outl}(W_3)/C_{inl}(W_3) < k_{eff}, \quad (iii)$$

When the state (iii) has developed, the dopant is charged to the silicon melt stored in the outer crucible using the dopant feeding apparatus so as to cause the dopant concentration ratio to again become $$C_{outl}(W_{1'})/C_{inl}(W_{1'}) > k_{eff}. \quad (i')$$

At this time, more preferably, when $C_{inl}(W_3) = C_{inl}(W_1) = C_{inl}(O)$ is accomplished in the state (iii), the dopant is charged to the silicon melt stored in the outer crucible such that $C_{outl}(W_{1'}) = C_{outl}(W_1) = C_{outl}(O)$ is satisfied.

Subsequently, if the dopant concentration ratio becomes smaller than the effective segregation coefficient, charging of the dopant to the silicon melt stored in the outer crucible is repeated, whereby $C_{inl}(W)$ can be controlled within a certain range. As a result, the ratio of resistivity of the silicon monocrystal; namely, $C_s(O)/C_s(W)$, can be controlled within a constant range.

The method of manufacturing a silicon monocrystal will be described in more detail with reference to FIGS. 2 through 5.

The dopant has been previously charged to the silicon melt before a silicon material is pulled. After the pulling of the silicon monocrystal has been commenced, the dopant is not charged to the silicon melt. In this state, while the granular silicon material is supplied via the feed pipe to the silicon melt stored in the outer crucible so as to maintain a constant amount of silicon melt in the double quartz-crucible, the silicon monocrystal is pulled. At this time, the relationship between the weight W of crystallized silicon and the dopant concentration $C_{inl}(W)$ of the silicon melt of the inner crucible obtained at the weight W is expressed by Equation (1):

$$C_{inl}(W) = e^{\frac{-k_{eff}}{W_{inl}(0)} \cdot W} \cdot \left[ C_{inl}(0) + \frac{W_{outl}(0)}{[-W_{inl}(0) + k_{eff} \cdot W_{outl}(0)]} \cdot C_{outl}(0) \cdot \left( e^{\frac{k_{eff} \cdot W_{outl}(0) - W_{inl}(0)}{W_{inl}(0) \cdot W_{outl}(0)} \cdot W} - 1 \right) \right] \quad (1)$$

where, $k_{eff}$ is an effective segregation coefficient, $W_{inl}(O)$ is the weight of the silicon melt contained in the inner crucible when pulling of the silicon monocrystal is commenced, $W_{outl}(O)$ is the weight of the silicon melt stored in the outer crucible when the pulling of the silicon monocrystal is commenced; $C_{inl}(O)$ is the dopant concentration of the silicon melt stored in the inner crucible when the pulling of the silicon monocrystal is commenced; and $C_{outl}(O)$ is the dopant concentration of the silicon melt stored in the outer crucible when the pulling of the silicon monocrystal is commenced.

Figure 2:
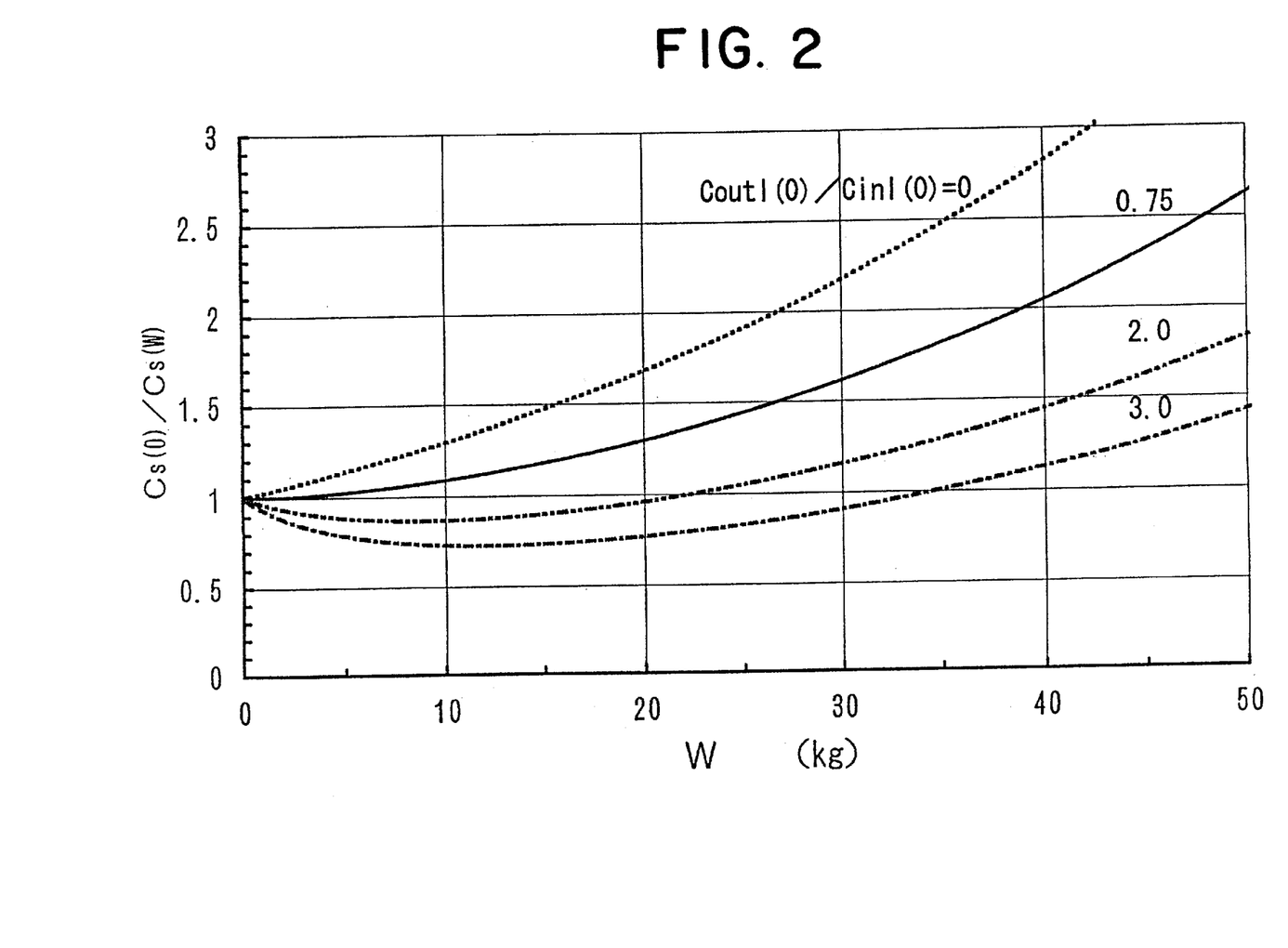
FIG. 2 is a graph illustrating the relationship between the weight W of crystallized silicon and a ratio of resistivity $C_s(O)/C_s(W)$ of the silicon monocrystal to be pulled obtained when the silicon monocrystal is pulled without addition of dopant after commencement of pulling of the silicon monocrystal, with regard to the respective cases where the dopant concentration ratio obtained at the time of commencement of the pulling of the silicon monocrystal, or $C_{outl}(O)/C_{inl}(O)$, is 0, 0.75, 2.0, and 3.0.

FIG. 2 illustrates the relationship between the weight W of crystallized silicon and the ratio of resistivity $C_s(O)/C_s(W)$ of the silicon monocrystal to be pulled obtained when the silicon monocrystal is pulled without addition of dopant after commencement of pulling of the silicon monocrystal, with regard to the respective cases where the dopant concentration ratio obtained at the time of commencement of the pulling of the silicon monocrystal, or $C_{outl}(O)/C_{inl}(O)$, is 0, 0.75 (which is the $k_{eff}$ of boron), 2.0, and 3.0. Using Equation (2), $C_s(W)$ is calculated from $C_{inl}(W)$ obtained by Equation (1).

$$C_s(W) = k_{eff} \times C_{inl}(W) \quad (2)$$

Here, the $k_{eff}$ of boron; namely, 0.75, is used as $k_{eff}$.

As illustrated in FIG. 2, where $C_{outl}(O)/C_{inl}(O)$ is larger than $k_{eff}$, or where $C_{outl}(O)/C_{inl}(O)$ is 2.0 or 3.0, the ratio of resistivity $C_s(O)/C_s(W)$ temporarily decreases so as to be smaller than one which is the value at the time of commencement of silicon monocrystal to be pulled. Then, the ratio of resistivity returns to one and further increases so as to be larger than one.

Figure 3:
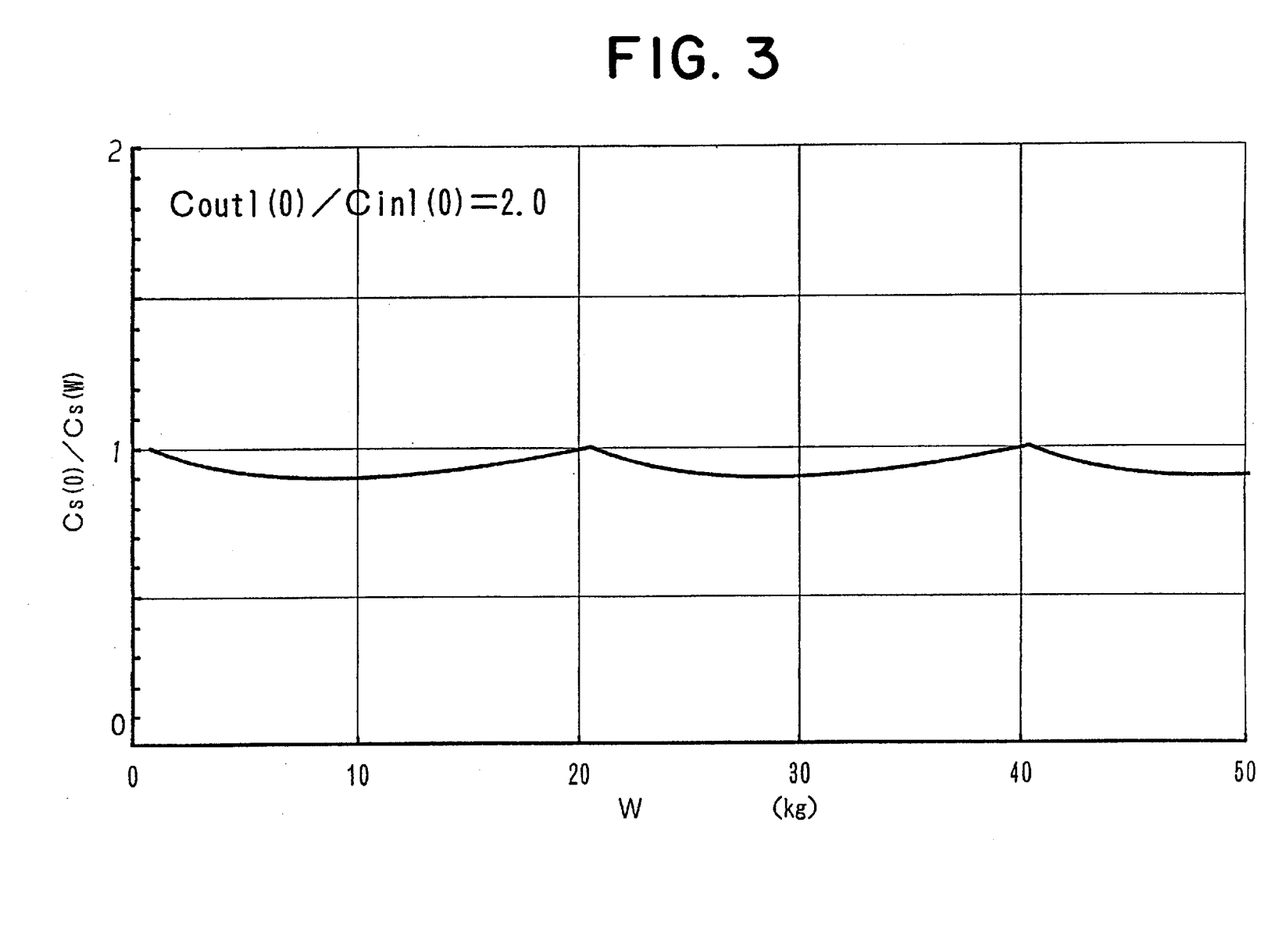
FIG. 3 is a graph illustrating variations in $C_s(O)/C_s(W)$ as a result of repetitive addition of a dopant to the silicon melt stored in the outer crucible according to the present invention, provided that the dopant concentration ratio at the time of commencement of the pulling of the silicon monocrystal is 2.0.

FIG. 3 is a graph illustrating variations in $C_s(O)/C_s(W)$ as a result of repetitive addition of the dopant to the silicon melt stored in the outer crucible according to the present invention, provided that the dopant concentration ratio obtained at the time of commencement of the pulling of the silicon monocrystal is 2.0.

As illustrated in FIG. 3, it is understood that the ratio of resistivity $C_s(O)/C_s(w)$ is controlled within a constant range by charging the dopant to the silicon melt of the outer crucible.

Figure 4:
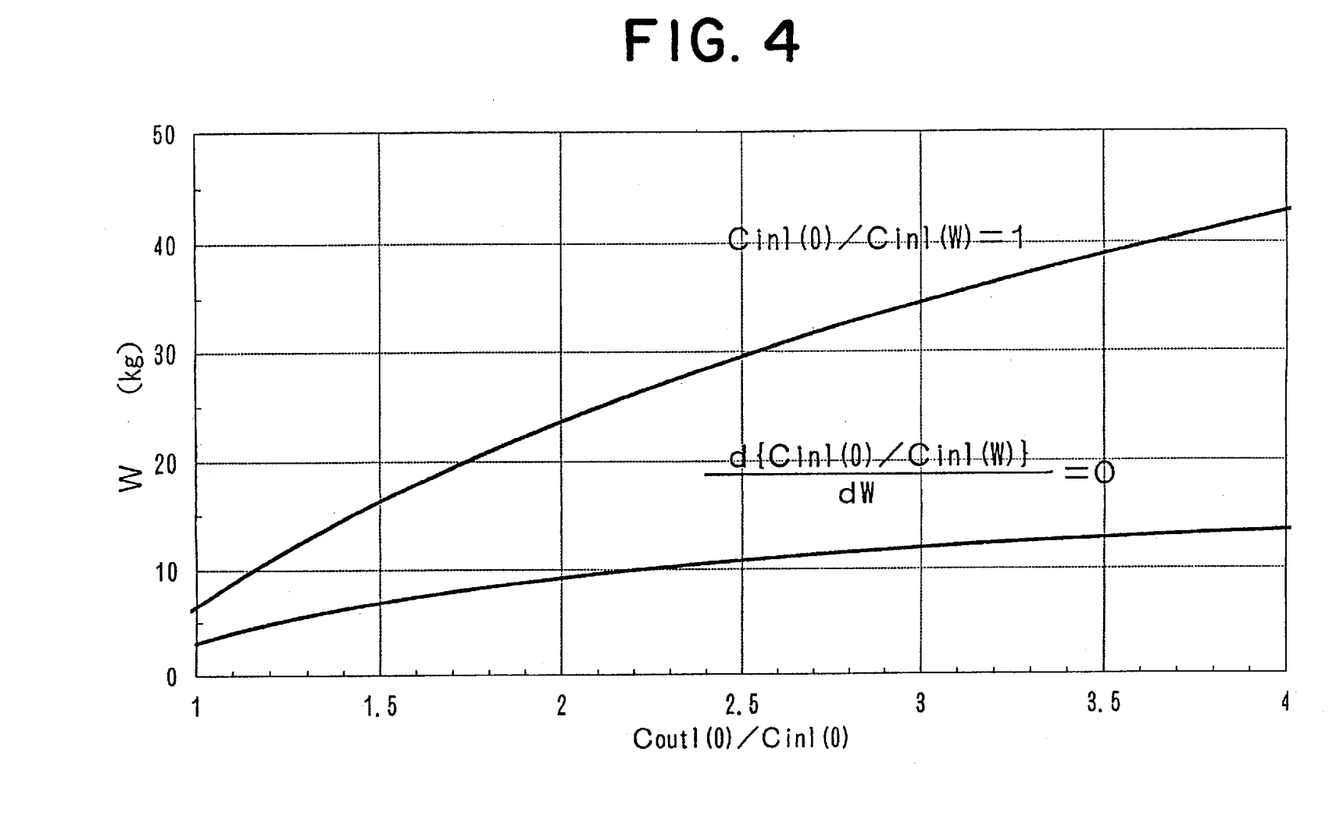
FIG. 4 is a graph illustrating the relationship between $C_{outl}(O)/C_{inl}(O)$ and the weight W of silicon which is crystallized until $C_s(O)/C_s(W)$ returns to one; i.e., an initial value at the time of commencement of the pulling of the silicon monocrystal; as well as the relationship between $C_{outl}(O)/C_{inl}(O)$ and W at a point of inflection in a $C_s(O)/C_s(W)$ curve.

In the present invention, before commencement of, or during the course of pulling of a silicon monocrystal, the dopant concentration ratio—i.e., $C_{outl}(W_1)/C_{inl}(W_1)$ or $C_{outl}(W_{1'})/C_{inl}(W_{1'})$—is increased so as to become larger than the effective segregation coefficient ($k_{eff}$). If this ratio is increased, the number of times that the dopant is charged per weight of crystallized silicon, will decrease. However, as illustrated in FIG. 4, the weight (W) of silicon which is crystallized until $C_s(O)/C_s(W)$ returns to one; i.e., a value before commencement of pulling of the silicon monocrystal, increases. As can be seen from FIG. 5, as the weight of the crystallized silicon increases, the range of resistivity ratio of the silicon monocrystal to be pulled becomes larger.

Accordingly, it is not desirable to excessively increase $C_{outl}(W_1)/C_{inl}(W_1)$ and $C_{outl}(W_1)/C_{inl}(W_1,i)$.

FIG. 4 is a graph illustrating the relationship between $C_{outl}(O)/C_{inl}(O)$ and the weight W of silicon which is crystallized until $C_s(O)/C_s(W)$ returns to one—i.e., an initial value at the time of commencement of the pulling of the silicon monocrystal; as well as the relationship between $C_{outl}(O)/C_{inl}(O)$ and W at a point of inflection in a $C_s(O)/C_s(W)$ curve.

Figure 5:
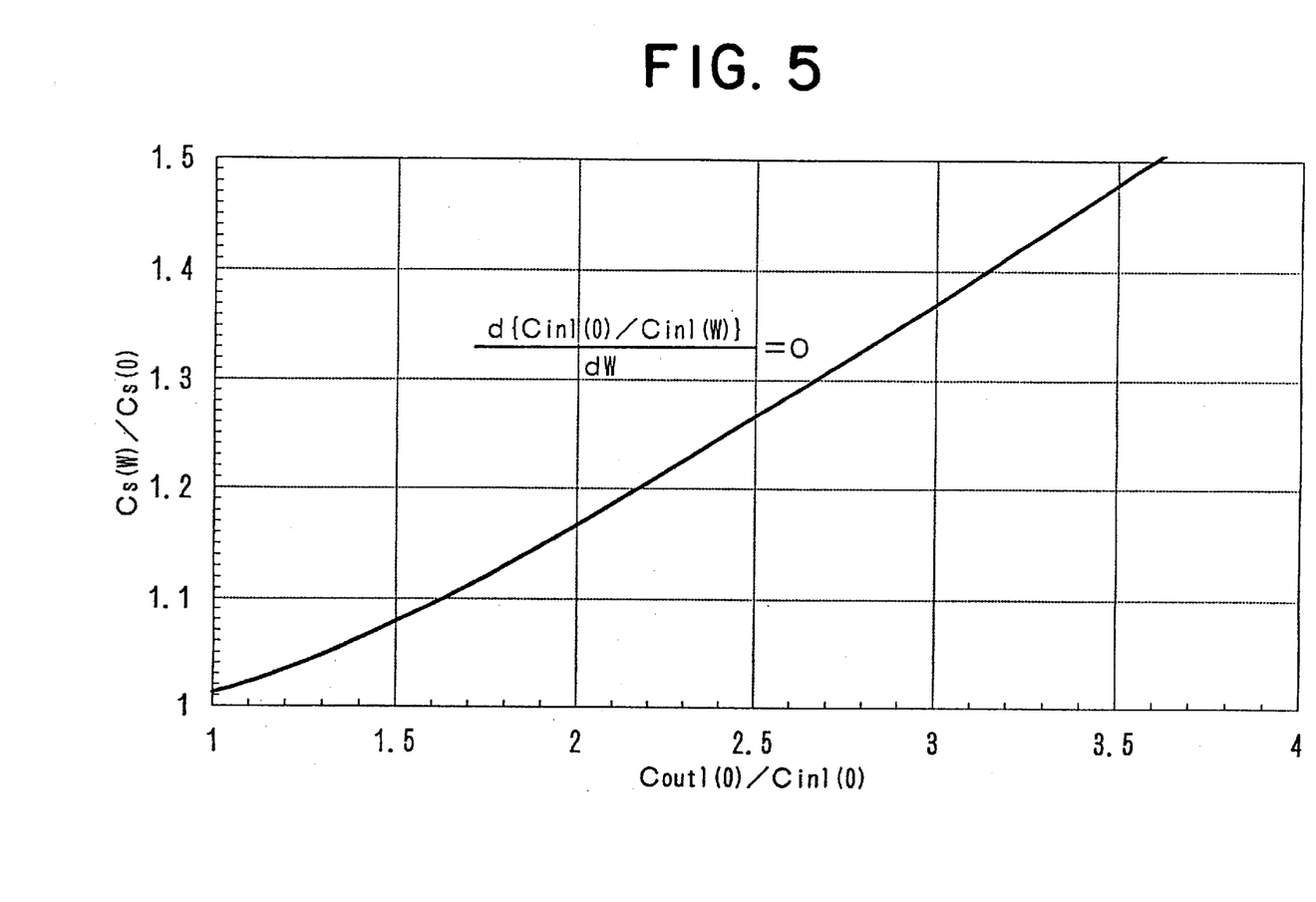
FIG. 5 is a graph illustrating the relationship between $C_{outl}(O)/C_{inl}(O)$ and the reciprocal of the ratio of resistivity of the silicon monocrystal to be pulled at a point of inflection of the $C_s(O)/C_s(W)$ curve; i.e., $C_s(W)/C_s(O)$.

FIG. 5 is a graph illustrating the relationship between $C_{outl}(O)/C_{inl}(O)$ and the reciprocal of the ratio of resistivity of the silicon monocrystal to be pulled at a point of inflection of the $C_s(O)/C_s(W)$ curve; i.e., $C_s(W)/C_s(O)$.

Figure 7A:
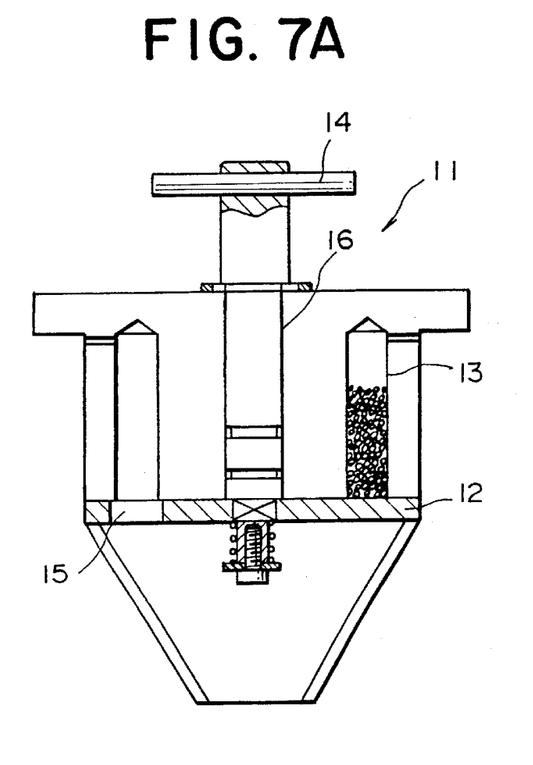
FIG. 7A is a cross-sectional view of a dopant feeding apparatus of the present invention.
Figure 7B:
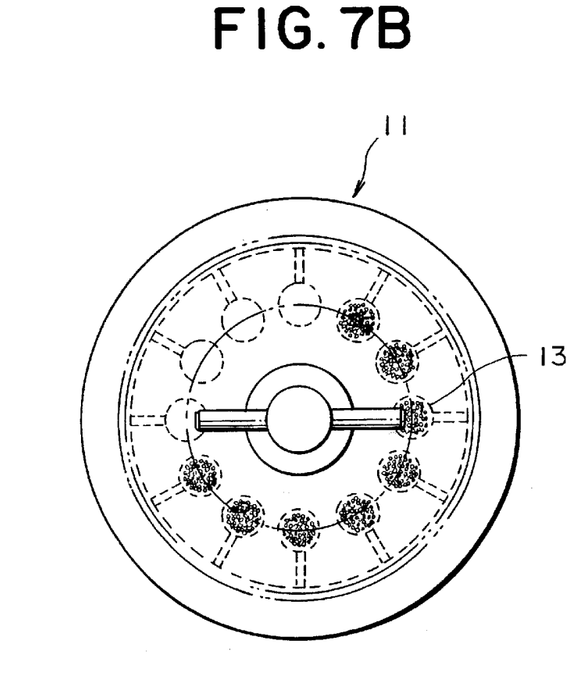
FIG. 7B is a plan view of the dopant feeding apparatus of the present invention.

According to the silicon monocrystal manufacturing method of the present invention, dopant is charged to the outer crucible several times during the course of pulling of the silicon monocrystal. The charging of dopant to the silicon melt does not require any special dopant feeding equipment. A dopant feeding apparatus of any type may be used so long as it has a plurality of dopant storage sections and is capable of charging a predetermined amount of dopant to silicon melt several times at desired points in time. For example, a dopant feeding apparatus 11 as provided in FIGS. 7A and 7B is used.

The dopant feeding apparatus 11 is provided with a plurality of dopant feed pipes 13 which serve as dopant storage sections. More specifically, in the dopant feeding apparatus 11 shown in FIGS. 7A and 7B, the twelve feed pipes 13 are provided at 30° intervals around a rotary shaft 16. The lower ends of the dopant feed pipes 13 are open and in contact with a disk member 12, whereby the dopant stored in the dopant feed pipes is prevented from being discharged. The disk member 12 is rotatable about the rotary shaft 16. By rotation of a handle 14 mounted on the uppermost end of the rotary shaft 16, the disk member 12 can be rotated via the rotary shaft 16. One aperture 15 is formed in the disk member 12. When the aperture 15 is brought in line with the open end of each dopant feed pipe 13 by rotating the disk member 12 using the handle 14, the dopant stored in the feed pipe 13 is added to the silicon melt through the aperture 15. Where the dopant feeding apparatus shown in FIGS. 7A and 7B is used, the amount of dopant required by one charging operation is previously stored in each of the feed pipes 13. Therefore, by rotating the disk member 12 by an angle of 30° using the handle 14, a predetermined amount of dopant can be supplied to the silicon melt stored in the outer crucible several times at desired points in time.

The dopant feed pipes 13 may be arranged linearly. Further, although one disk member is used in the dopant feeding apparatus shown in FIGS. 7A and 7B, a member of any shape may be used so long as it is capable of preventing the dopant stored in the dopant feed pipes from being discharged. Further, the number of members is not limited to one. Further, the dopant feed pipes may be movably arranged so long as the aperture 15 formed in the disk member 12 can be brought in alignment with the open ends of the dopant feed pipes at a desired time.

EXAMPLE

An example of the present invention will now be described.

Through use of a double crucible consisting of an outer crucible having a diameter of 18 inches and an inner crucible having a diameter of 14 inches, a silicon monocrystal having a diameter of 6 inches was manufactured using a CCZ method.

The double crucible was filled with silicon melt, and dopant was charged to the outer and inner crucibles before commencement of pulling of a silicon monocrystal such that the dopant concentration of the silicon melt stored in the outer crucible became twice that of the silicon melt stored in the inner crucible. Subsequently, the pulling of a silicon monocrystal was commenced. At this time, the amount of the silicon melt stored in the double crucible was maintained constant by supplying granular silicon material to the outer crucible through the feed pipe.

When the dopant concentration ratio became smaller than the effective segregation coefficient, and the dopant concentration of the silicon melt of the inner crucible became equal to the dopant concentration of the silicon melt of the inner crucible before the pulling of the silicon monocrystal was started; more specifically, when the weight of the crystallized silicon reached 5 kg, 23 kg, or 34 kg (or when the length of the body portion of the silicon monocrystal to be pulled reached 10 cm, 50 cm, or 75 cm), the dopant concentration of the silicon melt of the outer crucible was controlled so as to become equal to the dopant concentration of the silicon melt of the outer crucible before commencement of pulling of the silicon monocrystal, by charging the dopant to the silicon melt of the outer crucible using the dopant feeding apparatus.

Figure 6:
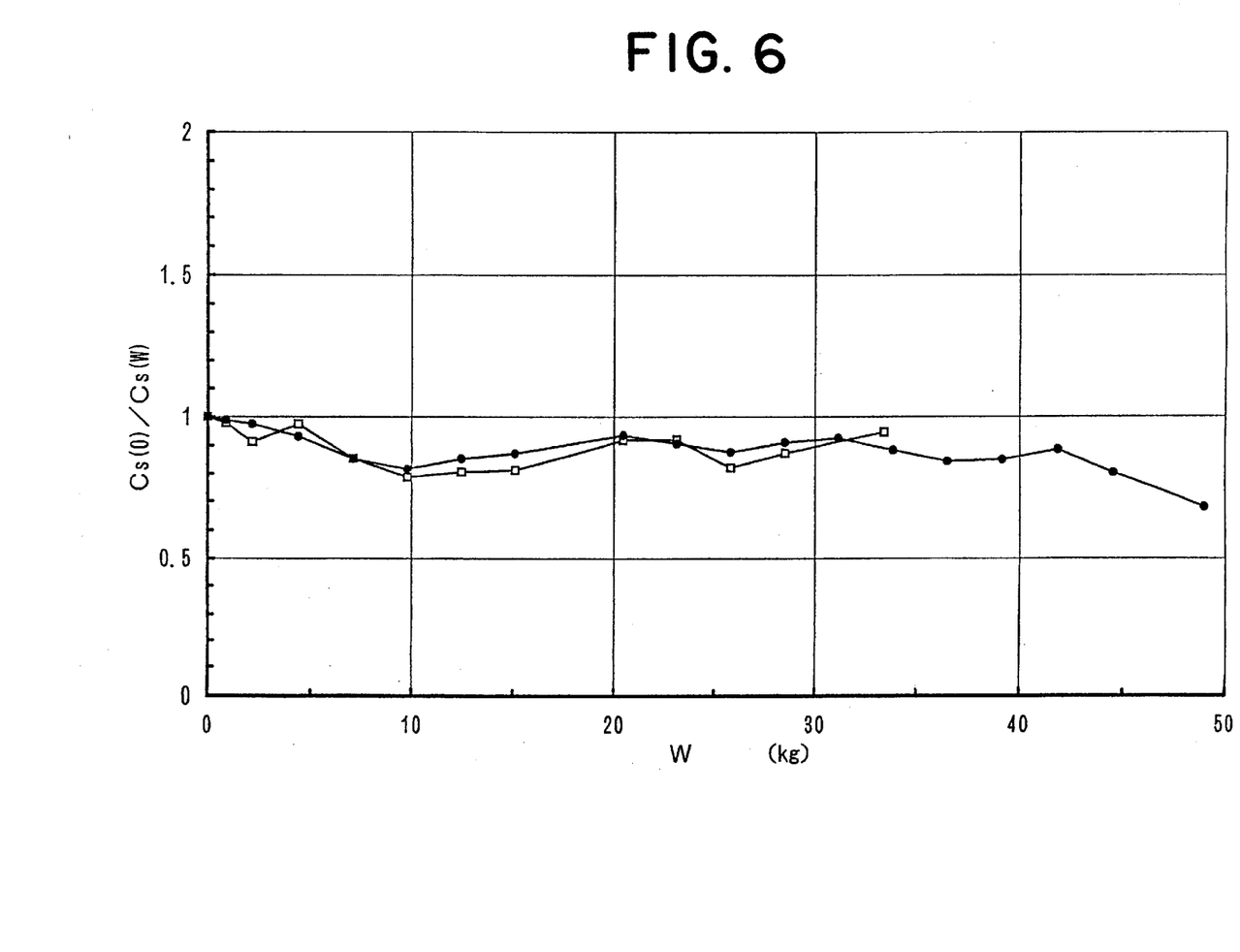
FIG. 6 is a graph illustrating the result of measurement of the ratio of resistivity of the silicon monocrystal according to an example of the present invention.

FIG. 6 illustrates results of measurement of the ratio of resistivity [that is, $C_s(O)/C_s(W)$] of the silicon monocrystal that was pulled in the test.

As is seen from FIG. 6, the reciprocal of the ratio of resistivity of the silicon monocrystal was able to be controlled so as to become less than 1.3.

What is claimed is:

1. A method of manufacturing a silicon monocrystal according to a continuously charged Czochralski method in which the silicon monocrystal is pulled while silicon material is charged to silicon melt stored in a crucible, wherein said crucible is a double crucible including an outer crucible and an inner crucible which communicate with each other through pores, and said method comprises the steps of:

(a) charging a dopant to the silicon melt stored in the double crucible before commencing pulling of a silicon monocrystal such that a ratio of the dopant concentration of the silicon melt stored in the outer crucible to the dopant concentration of the silicon melt stored in the inner crucible becomes greater than an effective segregation coefficient of the dopant;

(b) pulling the silicon monocrystal while charging silicon material to the silicon melt within the outer crucible, during which the dopant concentration ratio becomes equal to the effective segregation coefficient and subsequently becomes smaller than the effective segregation coefficient;

(c) recharging the dopant to the silicon melt stored in the outer crucible when the dopant concentration ratio becomes smaller than the effective segregation coefficient such that the dopant concentration ratio becomes greater than the effective segregation coefficient; and (d) repeating the recharging step (c).

2. A method of manufacturing a silicon monocrystal according to claim 1, wherein when the dopant concentration of the silicon melt stored in the inner crucible becomes equal to its initial value before commencement of pulling of the silicon monocrystal, the dopant is charged to the silicon melt of the outer crucible.

3. A method of manufacturing a silicon monocrystal according to claim 1, wherein when the dopant concentration of the silicon melt stored in the inner crucible becomes equal to its initial value before commencement of pulling of the silicon monocrystal, the dopant concentration of the silicon melt stored in the outer crucible is made equal to its initial value before commencement of pulling of the silicon monocrystal by charging the dopant to the silicon melt of the outer crucible.

4. A method of manufacturing a silicon monocrystal according to claim 1, wherein the dopant is charged to the silicon melt stored in the double crucible using a dopant feeding apparatus that comprises a plurality of dopant storage sections and can charge the dopant to the silicon melt a plurality of times.

5. A method of manufacturing a silicon monocrystal according to claim 1, wherein the dopant is charged to the silicon melt stored in the double crucible using a dopant feeding apparatus comprising:
   a plurality of dopant feed pipes each having an open end and being sized to store dopant; and
   at least one plate member disposed in contact with the open end of each of the dopant feed pipes, the at least one plate member having an aperture for discharging the dopant stored in each of the dopant feed pipes through the open end of the dopant feed pipes, the at least one plate member being movable such that the aperture faces the open end of one of the dopant feed pipes when the dopant is discharged to the silicon melt.

6. A method of manufacturing a silicon monocrystal according to claim 5, wherein the plurality of dopant feed pipes are arranged in a circular configuration, the at least one plate member is rotatable, and when the dopant is discharged to the silicon melt, the at least one plate member is rotated such that the aperture faces the open end of one of the dopant feed pipes.

7. A method of manufacturing a silicon monocrystal according to a continuously charged Czochralski method in which the silicon monocrystal is pulled while silicon material is charged to silicon melt stored in a double crucible, wherein the double crucible comprises an outer crucible and an inner crucible in communication with the outer crucible, the method comprising the steps of:
   (a) charging a dopant to the silicon melt stored in the double crucible before commencing pulling of a silicon monocrystal such that a ratio of the dopant concentration of the silicon melt stored in the outer crucible to the dopant concentration of the silicon melt stored in the inner crucible becomes greater than an effective segregation coefficient of the dopant;
   (b) pulling the silicon monocrystal while charging silicon material to the silicon melt within the outer crucible; and
   (c) recharging the dopant to the silicon melt stored in the outer crucible during pulling when the dopant concentration ratio becomes smaller than the effective segregation coefficient such that the dopant concentration ratio becomes greater than the effective segregation coefficient.

8. A method of manufacturing a silicon monocrystal according to claim 7, wherein when the dopant concentration of the silicon melt stored in the inner crucible becomes equal to its initial value before commencement of pulling of the silicon monocrystal, the dopant is charged to the silicon melt of the outer crucible.

9. A method of manufacturing a silicon monocrystal according to claim 7, wherein when the dopant concentration of the silicon melt stored in the inner crucible becomes equal to its initial value before commencement of pulling of the silicon monocrystal, the dopant concentration of the silicon melt stored in the outer crucible is made equal to its initial value before commencement of pulling of the silicon monocrystal by charging the dopant to the silicon melt stored in the outer crucible.

10. A method of manufacturing a silicon monocrystal according to a continuously charged Czochralski method in which the silicon monocrystal is pulled while silicon material is charged to silicon melt stored in a double crucible, wherein the double crucible comprises an outer crucible and an inner crucible in communication with the outer crucible, the method comprising the steps of:
   (a) charging a dopant to the silicon melt stored in the double crucible before commencing pulling of a silicon monocrystal such that a ratio of the dopant concentration of the silicon melt stored in the outer crucible to the dopant concentration of the silicon melt stored in the inner crucible becomes greater than an effective segregation coefficient of the dopant;
   (b) pulling the silicon monocrystal while charging silicon material to the silicon melt within the outer crucible; and
   (c) recharging the dopant to the silicon melt stored in the outer crucible during pulling when the dopant concentration ratio becomes smaller than the effective segregation coefficient such that the dopant concentration ratio becomes greater than the effective segregation coefficient;
      wherein a ratio of the initial resistivity of the silicon monocrystal, $C_s(O)$, to the resistivity of the silicon monocrystal after being grown to a weight W, $C_s(W)$, is controlled during pulling of the silicon monocrystal.

11. A method of manufacturing a silicon monocrystal according to claim 10, wherein the ratio is maintained at about 1 during pulling of the silicon monocrystal.

12. A method of manufacturing a silicon monocrystal according to claim 10, further comprising the step of repeating the recharging step (c).

* * * * *